United States Patent [19]

Davis et al.

[11] 4,149,085
[45] Apr. 10, 1979

[54] AUTOMATIC OVERLAY MEASUREMENTS USING AN ELECTRONIC BEAM SYSTEM AS A MEASUREMENT TOOL

[75] Inventors: Donald E. Davis, Wappingers Falls; Edward V. Weber, Poughkeepsie; Maurice C. Williams, Wappingers Falls; Ollie C. Woodard, Poughkeepsie, all of N.Y.

[73] Assignee: International Business Machines Corporation, Armonk, N.Y.

[21] Appl. No.: 869,972

[22] Filed: Jan. 16, 1978

[51] Int. Cl.² .............................................. H01J 37/00
[52] U.S. Cl. .................................. 250/492 A; 250/398
[58] Field of Search ................... 250/492 A, 398, 392; 219/121 EB, 121 EM

[56] References Cited

U.S. PATENT DOCUMENTS

| | | | |
|---|---|---|---|
| 3,644,700 | 2/1972 | Kruppa et al. | 250/492 A |
| 3,875,414 | 4/1975 | Prior | 250/492 A |
| 3,875,416 | 4/1975 | Spicer | 250/492 A |
| 4,056,730 | 11/1977 | Davis et al. | 250/492 A |

Primary Examiner—Bruce C. Anderson
Attorney, Agent, or Firm—James M. Thomson

[57] ABSTRACT

A method and apparatus is described for performing automatic overlay measurements on wafers utilized in semiconductor manufacturing. The overlay measurements are made at selected sites on a given wafer where a single bar pattern has been overlaid over a double bar pattern. The position of the single bar center line with respect to the center line between the double bars is a direct indication of the overlay error of the two patterns. The overlay error is measured in both the X and Y dimensions and is utilized to monitor the overlay error or to produce statistics and correlations to system parameters so that the sources of overlay errors may be identified and the errors eliminated or minimized on subsequent wafers being processed.

8 Claims, 5 Drawing Figures

AUTOMATIC OVERLAY MEASUREMENTS USING AN ELECTRONIC BEAM SYSTEM AS A MEASUREMENT TOOL

BACKGROUND OF THE INVENTION

The present invention relates to a method and apparatus for utilizing a direct writing electron beam system as a measurement tool for measuring overlay error. More particularly, the invention comprises a novel method of measuring overlay error between a first pattern and a second pattern which are deposited upon a wafer utilized in semiconductor manufacturing.

In fabricating semiconductor wafers it is necessary to fabricate multiple layers upon the wafer in order to produce specific semiconductor devices and interconnections to these devices. This entails a requirement for accurately aligning the base of a semiconductor device, for example, in a first layer with an emitter for the same semiconductor device, fabricated as part of a second layer or processing step. The non perfect alignment which occurs between a feature in the first layer and a feature in a subsequently applied layer is referred to in the art as overlay error.

Various techniques have been utilized in the prior art to accurately position multiple layers with satisfactory alignment. Heretofore, none of the methods entailed the use of an electron beam system which was also utilized in the manufacturing process as a direct writing instrument. Accordingly, the present invention involving the use of an electron beam system as an overlay measurement instrument is believed to be novel. It enables large volumes of overlay data to be automatically and accurately collected, eliminating operator errors that would result from a more conventional means of data gathering. Furthermore, it can result in further cost efficiencies since it may not require utilization of a second instrumentation means to control overlay alignment but, in the preferred embodiment, uses the fabrication means with no hardware modifications.

The following patents, all assigned to International Business Machines Corporation, provide background information and are incorporated herein by reference.

U.S. Pat. No. 3,644,700 for "Method And Apparatus For Controlling An Electron Beam" by Kruppa.

U.S. Pat. No. 3,866,013 for "Method And Apparatus For Controlling Movable Means Such As An Electron Beam" by Ryan.

U.S. Pat. No. 3,875,415, for "Method And Apparatus For Detecting A Registration Mark On A Target Such As A Semiconductor Wafer" by Woodard.

U.S. Pat. No. 3,901,814 for "Method And Apparatus For Detecting A Registration Mark On A Target Such As A Semiconductor Wafer" by Davis et al.

U.S. Pat. No. 3,900,736 to Michail et al. for "Method And Apparatus For Positioning A Beam Of Charged Particles".

U.S. Pat. No. 4,056,730 to Davis et al., for "Apparatus For Detecting Registration Marks On A Target Such As A Semiconductor Wafer".

Of the prior art patents mentioned above, U.S. Pat. No. 4,056,730 is believed to be of significant value in terms of providing background for this invention. The aforesaid patent describes apparatus for detecting registration marks on a semiconductor wafer including means for operating upon signals picked-up by diode detectors when electrons are backscattered from the target. The apparatus disclosed therein further includes means for differentiating the backscatter signal, and if more than one signal is used, means for summing the signals just before or just after differentiating. The purpose of the Davis et al. patent is to provide a technique for accurately determining when the electron beam spot of the system scans over a particular registration mark or indicia.

SUMMARY OF THE INVENTION

The present invention comprises a method of measuring overlay error in semiconductor wafers utilizing an electron beam system similar to that described in the aforementioned patents; and particularly an electron beam system utilizing a detection means such as that described in the aforementioned Davis et al. patent.

The method involves the use of a first bar pattern or indicia laid down on the semiconductor wafer at a selected site which is predetermined with respect to the registration marks utilized in such systems. A second bar pattern or indicia is then laid down in an overlay or proximate relationship to the first bar pattern. In the preferred embodiment a single bar pattern is overlaid onto a double bar pattern in both the X and Y dimensions.

The position of the single bar center line with respect to the center line between the double bars is then measured. This is an indication of the overlay error of the two patterns or layers. To measure the overlay error the electron beam is scanned across the patterns and the backscattered electrons are utilized to detect when the beam crosses the edge of each pattern. The analog signals from the edges are processed by circuitry described in U.S. Pat. No. 4,056,330 to produce digital data that represents the edge positions. The data is accumulated refined and reduced by means discussed in detail hereinafter to determine the overlay errors. The overlay errors can then be utilized in well known fashion to prevent or minimumize overlay errors which occur during processing of subsequent semiconductor wafers.

BRIEF DESCRIPTION OF THE DRAWINGS

The foregoing and other features and advantages of the invention will become apparent from the following description of the invention taken in conjunction with the accompanying drawings wherein.

DETAILED DESCRIPTION OF THE INVENTION

Figure 1:
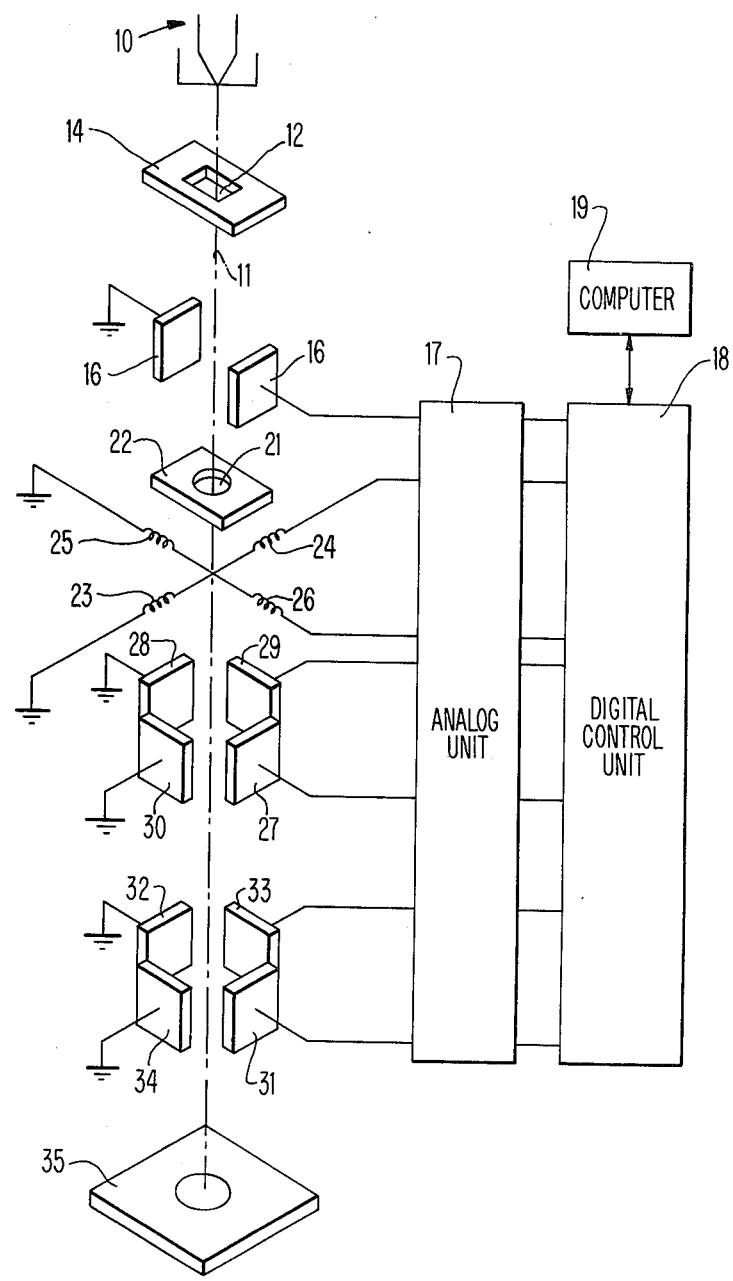
FIG. 1 is a schematic view showing an electron beam system with means for controlling the beam.

Referring now to the drawings and particularly to FIG. 1, there is shown an electron gun 10 for producing a beam 11 of charged particles in the well-known manner. The electron beam 11 is passed through an aperture 12 in a plate 14 to shape the beam 11. The beam 11 is preferably square shaped and has a size equal to the minimum line width of the pattern that is to be formed.

The beam 11 passes between a pair of blanking plates 16, which determine when the beam 11 is applied to the material and when the beam 11 is blanked. The blanking plates 16 are controlled by circuits of an analog unit 17. The analog unit 17 is controlled by a digital control unit 18 in the manner more particularly shown and described in U.S. Pat. No. 3,866,013. The digital control unit 18 is connected to a computer 19, which is preferably an IBM System/370 computer.

The beam 11 then passes through a circular aperture 21 in a plate 22. This controls the beam 11 so that only the charged particles passing through the centers of the lenses (not shown) are used, producing a square-shaped spot without any distortion.

The beam 11 is next directed through magnetic deflection coils 23, 24, 25 and 26. The magnetic deflection coils 23 and 24 control the deflection of the beam 11 in a horizontal (or X) direction while the magnetic deflection coils 25 and 26 control the deflection of the beam 11 in a vertical (or Y) direction. Accordingly, the coils 23-26 cooperate to move the beam 11 in a horizontal scan by appropriately deflecting the beam. While the beam 11 could be moved in a substantially raster fashion as shown and described in U.S. Pat. No. 3,644,700 to Kruppa et al., it is preferably moved in a back and forth scan so that the beam 11 moves in alternately opposite directions along adjacent lines as shown and described in the aforesaid Ryan and Michail et al. patents.

The beam 11 then passes between a first set of electrostatic deflection plates 27, 28, 29 and 30. The electrostatic deflection plates 27 and 28 cooperate to deflect the beam in a horizontal (or X) direction while the electrostatic deflection plates 29 and 30 cooperate to move the beam 11 in a vertical (or Y) direction. The plates 27-30 are employed to provide any desired offset of the beam 11 at each of the predetermined positions or spots to which it is moved. Linear correction signals are supplied to the coils 23-26.

After passing between the electrostatic deflection plates 27-30, the beam 11 then passes between a second set of electrostatic deflection plates 31, 32, 33 and 34. The electrostatic deflection plates 31 and 32 cooperate to deflect the beam 11 in the X direction while the electrostatic deflection plates 33 and 34 cooperate to move the beam 11 in the Y direction. The plates 31-34 are employed to shift the beam 11, as more particularly shown and described in the aforesaid Michail et al. patent, at each of the predetermined positions to which the beam 11 is moved to move the beam 11 from the predetermined position to the actual deviated position at which the beam 11 must be applied to fit the pattern within the actual field.

The beam 11 is then applied to a target, which is supported on a table 35. The table 35 is also movable in the X and Y direction as more particularly shown and described in the aforesaid Kruppa et al. patent.

The beam 11 is moved through A, B and C cycles as shown and described in the aforesaid Kruppa et al. patent, and the signals are processed during the A cycle of the beam 11 to detect the location of each of the registration marks. In accordance with the teaching of the aforesaid patents, there is a registration mark located in each of the four corners of each of the multiple fields of the wafer. If the fields overlap the same registration mark is utilized for each of four different adjacent fields. As explained in the Michail et al patent the registration mark at each of the four corners of the field is used to locate the field in which writing of the pattern is to occur. The exact location of each of the registration marks is obtained by scanning the electron beam across the edges formed by the registration marks on the wafer. The beam scanning is done in a direction perpendicular to the edges formed by the registration marks on the wafer. The registration detector is utilized to detect when the electron beam 11 passes over the edges of each of these marks.

Figure 2:
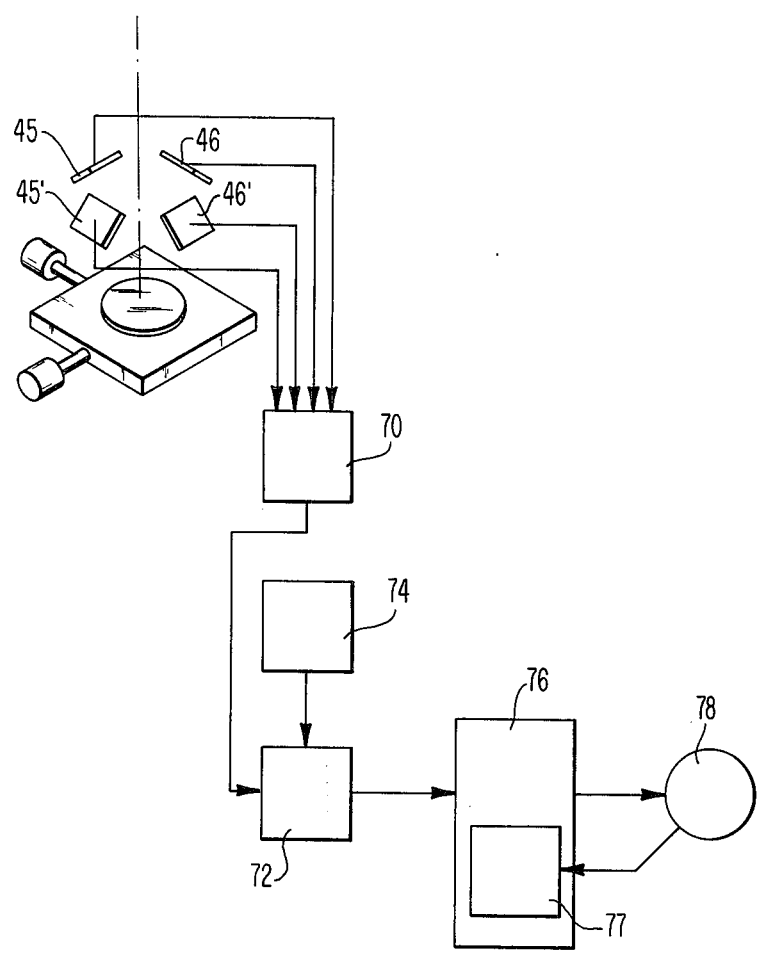
FIG. 2 is a schematic block diagram of detection and signal processing means associated with the system of FIG. 1 which is utilized in accordance with the present invention.

The registration detector preferably includes four diodes 45, 46, 45' and 46' disposed as shown in FIG. 2 above the semiconductor wafer and having an opening formed therebetween through which the beam 11 passes to impinge upon a portion of the wafer. The four diodes 45, 46, 45' and 46' are preferably arranged in quadrants as shown.

During an X scan, the backscatter of the electrons from the semiconductor wafer changes when the beam 11 passes over one of the edges of one of the bars of the X registration mark. Each of the bars of the registration mark is typically formed either by a depression or by a raised portion in the surface of the wafer.

Using backscattered signals similar to those utilized for registration of patterns, the present invention involves a technique for measuring other features on the wafer surface as an indication of overlay error. This involves the utilization of the electron beam system as a measurement tool rather than as a high-throughput direct wafer writing tool.

The overlay measurements are made at selected sites on the wafer where a single bar pattern in one layer has been overlaid onto a double bar pattern laid down as part of another layer of material applied to the wafer site during processing. The position of the single bar center line with respect to the center line between the double bars is a direct indication of the overlay error of the two patterns.

Figure 3:
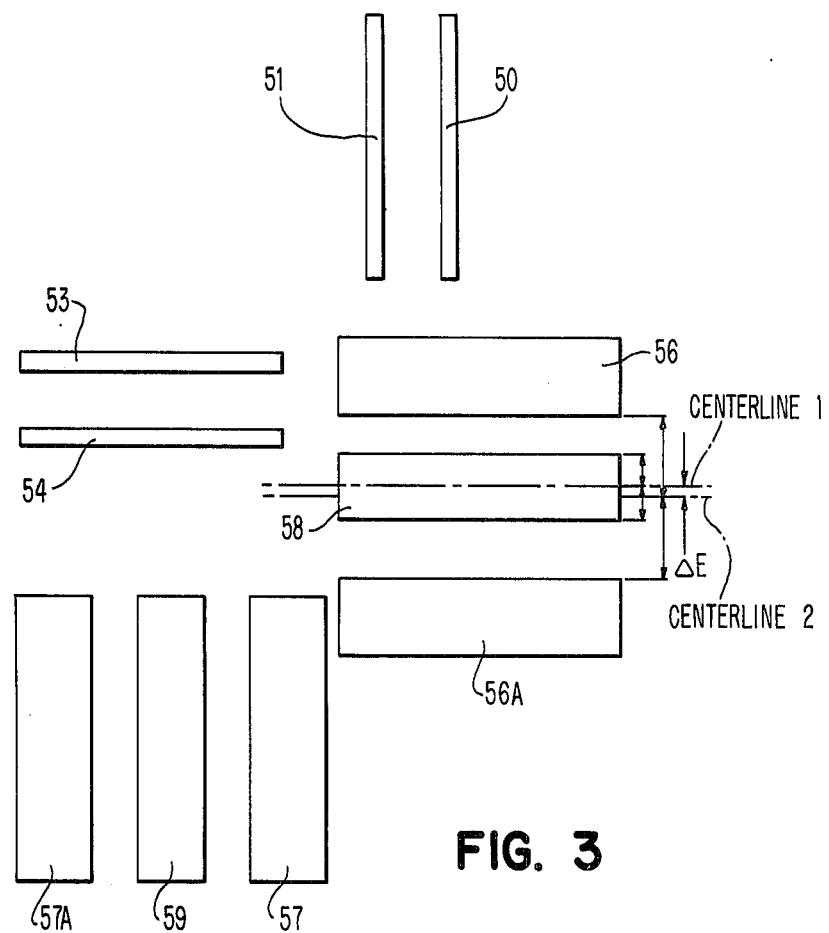
FIG. 3 is a plan view of a set of registration marks and pattern indicia utilized in practicing the invention.

Referring now to FIGS. 2-4 the manner in which the overlay patterns are deposited will be explained. In FIG. 3 a first pair of registration marks 50, 51 are represented and a second pair of registration marks 53, 54 are represented. These registration marks are located in the four corners of each field and represent the registration marks which are utilized for registration and alignment in the aformentioned patents. Thus, marks 50, 51 represent the X direction registration marks and marks 53, 54 represent the Y direction marks. The pair of registration marks, rather than a single bar are utilized for purposes of this invention as explained hereinafter.

In addition to the registration marks a pair of double bar patterns 56 and 56A as well as a pair of double bar patterns 57 and 57A are provided. These double bar patterns are located at positions which are specifically determined with respect to the respective registration marks they are associated with; and the patterns can be laid down in the same layer of material or during the same processing step as are registration marks 50, 51, 53, 54, if desired. Alternatively, the double bar patterns can be laid down in a separate processing step but registered to the registration marks by previously explained alignment techniques. The purpose of orienting these patterns with respect to the registration marks is simply to permit their subsequent location for scanning by the electron beam during the overlay measurement processing.

In the preferred embodiment the first or double bar patterns 56, 56A, 57, 57A are placed on the wafer by the conventional steps of exposing a layer of resist utilizing the electron beam, developing the resist and etching the marks into the wafer in well known fashion. The wafer is then recoated with resist and a second set of single bar patterns 58, 59 are formed on the wafer by exposing developing and etching them into the wafer again in well known fashion. It should be apparent, however, that the first or double bar pattern is placed upon the wafer in a different processing step than the second or single bar pattern. Consequently, the placement of the second pattern with respect to the first pattern is an indication of the overlay error resulting from the registration of the second layer with respect to the first layer.

It should be noted that the second pattern is laid down by first registering the electron beam on the registration marks and then proceeding to expose the patterns in the desired positions. However, since exposure to the registration scanning may cause the registration marks to be altered by subsequent processing, a second set of registration marks is provided in both the X and Y directions. This permits registration on the first set of marks for purposes of laying down the second bar patterns; and utilization of the second set of registration marks for subsequent location of the overlay patterns for scanning and measurement purposes.

Figure 4A:
FIG. 4A is a representation of the vertical profile of the overlay patterns of FIG. 3.
Figure 4B:
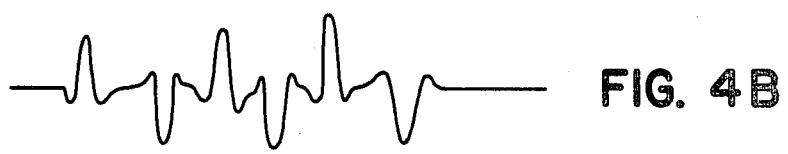
FIG. 4B is a representation of the electrical signals produced by the circuit of FIG. 2 as the electron beam is scanned over such patterns.

The positioning of the single bar center line with respect to the double bar center lines in both the X and Y directions is illustrated in FIG. 3; and the positioning is in direct proportion to the overlay error of the two patterns. The vertical profile of the overlay pattern is illustrated in FIG. 4A and the electrical output signal attained when the electron beam is scanned over the overlay pattern is illustrated in FIG. 4B. Thus, the singal representation of FIG. 4A results from a differentiated output signal provided by circuitry described in the aforementioned Davis et al. patent and permits accurate location of the edges of the overlay pattern as illustrated in FIG. 3.

To measure the overlay error of a given wafer, the automatic registration and correction capability of the system is used to accurately position the beam scanning pattern over the registration marks. After each set of measurements is made the X-Y table moves to the next chip site on the wafer. The specific chip sites and the relative positions of the overlay pattern features to the registration marks may be selected, if desired, to allow overlay measurement at multiple points over the chip. Furthermore, the data from the measurement scans may be recorded on tape or other storage media for later editing and data reduction.

The signal generated as the beam is scanned across the edge into the wafer is sufficiently prominent that overlay features will be seen even if they are beneath several microns of an overlay material.

Referring now to FIG. 2, the manner in which the backscattered electron signals are processed is explained in more detail. As the electron beam is scanned back and forth and across an overlay pattern feature on the wafer surface, the detected backscattered electron signal is modulated, thus providing a signal which is received by electron detectors provided above the wafer. In the preferred embodiment four solid state diode detectors are utilized as described in the aforementioned patents.

The signals from the detector diodes are supplied to an analog signal processing block 70 which converts the diode output currents to voltage signals. The voltage signals are differentiated, filtered to remove unwanted high frequency noise, and summed. The amplitude of the peak summed signal is adjusted by an automatic gain control circuit to a fixed value.

The output signal is then supplied to a comparator circuit which comprises part of the analog signal processing block. The comparator has a reference input which has been automatically set to a fixed percentage of the base line to peak signal amplitude. The digital output signals from the comparator are then provided to a time encoding and data buffering block 72 which receives a clock signal from a system clock 74.

The digital signals are time encoded with reference to the system clock signal, which is in synchronism with the beam scanning deflection. The time encoded signals are then provided to a host computer which reads the data from the time encoding and data block and transfers it to a tape 78 where it is stored until it can be processed by a software editor 77.

The signal when translated can be utilized to provide an indication of the distance on the wafer between the center line of the first pattern and the center line of the second pattern. In order to correctly measure such indications, the data editor scans the signal for correct signal polarity sequences to choose valid edge data and tests for the proper width of the bar patterns being measured. This permits elimination of noisy data points and the reduced data represents overlay data for the first pattern and the second pattern.

Thus, the reduced data represents the overlay error in either the X or Y dimension at the location of each scanned overlay feature. Subsequent processing can be utilized to produce desired statistics and correlations to enable elimination of suspected error sources in the overlay patterning.

Such subsequent processing would be necessary with respect to utilizing overlay error measured by any other technique and accordingly does not form part of the present invention.

The present method of determining overlay error has been found to be an improvement over other methods in that it is carried out by an electron beam system which is also used in a direct writing mode. This eliminates any requirement for utilizing a different system for measurement than is utilized for writing. Moreover, the scanning across the overlay measurement patterns consists of both forward and backward scans to minimize errors arising from nonlinear scanning. This also permits cancellation of errors due to various delays in the signal paths within the system and has been found to be a particularly accurate technique. Moreover, the overlay measurement patterns were designed so that complementary pairs of edges are utilized for detection. This, in turn, eliminates the effects of etch variations on the overlay patterns utilized.

It should by recognized that although the first embodiment utilizes a square shaped beam, the measurements could be made using a round or preferably a rectangular shaped beam with the long edge parallel to the edges being measured. Also the first embodiment utilizes a particular combination of signal detectors and analog and digital signal processing and editing but could be replaced by other appropriate means. For example, scintillators could replace the diode detectors, manual gain setting could replace automatic gain setting, and/or edge identification could be determined by peak detection rather than the clipping method.

It should be recognized that although in the first embodiment the method described herein comprises the measuring of overlay error established between a first and second overlay patterns laid down by electron beam direct writing tools, the method is equally usable with respect to measuring overlay error between pattern indicia established on the chip by other means. For example, the overlay patterns could be provided on the wafer by other photolithographic apparatus of conventional design.

We claim:

1. A method of verifying the position of a second pattern in a layer on a target with respect to a first pattern previously established in another layer on the target comprising the steps of providing the first pattern on the target at a predetermined location which is relative to registration indicia on the target;

providing a second pattern on the target at a location above said first pattern and at a location relative to said registration indicia; and measuring with an electron beam system a distance between the second pattern and the first pattern in at least one direction by bombarding the target with electrons and detecting electrons backscattered from said patterns whereby the measured distance is proportional to overlay error and can be utilized to calculate overlay error for the patterns on the target.

2. The method of claim 1 wherein the target is a semiconductor wafer.

3. A method of verifying the position of a second pattern in a layer on a target with respect to a first pattern previously established in another layer on the target comprising the steps of a. writing the first pattern on the target by means of an electron beam system at a predetermined location which is relative to registration indicia on the target;

b. registering the electron beam field of the system with respect to the target using the registration indicia;

c. writing the second pattern on the target with the electron beam system at a location above said first pattern and at a location relative to said registration indicia; and d. measuring with the electron beam system the relative error between the second pattern and the first pattern in at least one axial dimension by bombarding the target with electrons and detecting electrons backscattered from said patterns whereby the error measured can be utilized to calculate the overlay error for the successive patterns on the target.

4. The method of claim 3 wherein the target is a semiconductor wafer.

5. The method of claim 3 wherein the measurement step is accomplished by a. scanning the first and second patterns with the electron beam;

b. Detecting transitions which occur in a backscattered electron signal when the electron beam passes the edge of each pattern; and c. processing the transition signals to detect the center lines of the first and second patterns whereby said overlay error proportional to offset error between said center lines can be calculated.

6. The method of claim 5 wherein the detecting step includes the technique of detecting pairs of signal transitions from the backscattered electron signal which occur when the beam crosses the edges of a given pattern feature.

7. The method of claim 4 wherein the measurement step is accomplished by a. scanning the first and second patterns with the electron beam;

b. detecting transitions which occur in a backscattered electron signal when the electron beam passes the edge of each pattern; and c. processing the transition signals to detect the center lines of the first and second patterns and determine offset error between said center lines whereby said overlay error can be calculated.

8. The method of claim 7 wherein the detecting step includes the technique of detecting pairs of signal transitions from the backscattered electron signal which occur when the beam crosses the edges of a given pattern feature.

* * * * *